(12) United States Patent
Wang et al.

(10) Patent No.: US 7,795,061 B2
(45) Date of Patent: Sep. 14, 2010

(54) METHOD OF CREATING MEMS DEVICE CAVITIES BY A NON-ETCHING PROCESS

(75) Inventors: Chun-Ming Wang, Fremont, CA (US); Jeffrey Lan, Cupertino, CA (US); Teruo Sasagawa, Los Gatos, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/321,134

(22) Filed: Dec. 29, 2005

(65) Prior Publication Data
US 2007/0155051 A1    Jul. 5, 2007

(51) Int. Cl.
*H01L 21/00* (2006.01)
(52) U.S. Cl. .................. 438/48; 438/619; 438/626; 438/624; 438/785; 438/787; 438/200; 438/800; 257/522; 257/644; 257/752; 257/217; 257/234; 257/252; 257/253; 257/254
(58) Field of Classification Search ................ 438/619, 438/623; 359/260
See application file for complete search history.

(56) References Cited
U.S. PATENT DOCUMENTS
2,534,846 A     12/1950   Ambrose et al.

(Continued)

FOREIGN PATENT DOCUMENTS
CH           681 047           12/1992
(Continued)

OTHER PUBLICATIONS
Jerman J. H. et al., "Maniature Fabry-Perot Interferometers Micromachined in Silicon for Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.
(Continued)

*Primary Examiner*—Fernando L Toledo
*Assistant Examiner*—Ankush K Singal
(74) *Attorney, Agent, or Firm*—Knobbe Martens Olson & Bear LLP

(57) ABSTRACT

MEMS devices (such as interferometric modulators) may be fabricated using a sacrificial layer that contains a heat vaporizable polymer to form a gap between a moveable layer and a substrate. One embodiment provides a method of making a MEMS device that includes depositing a polymer layer over a substrate, forming an electrically conductive layer over the polymer layer, and vaporizing at least a portion of the polymer layer to form a cavity between the substrate and the electrically conductive layer. Another embodiment provides a method for making an interferometric modulator that includes providing a substrate, depositing a first electrically conductive material over at least a portion of the substrate, depositing a sacrificial material over at least a portion of the first electrically conductive material, depositing an insulator over the substrate and adjacent to the sacrificial material to form a support structure, and depositing a second electrically conductive material over at least a portion of the sacrificial material, the sacrificial material being removable by heat-vaporization to thereby form a cavity between the first electrically conductive layer and the second electrically conductive layer.

21 Claims, 12 Drawing Sheets

U.S. PATENT DOCUMENTS

| | | |
|---|---|---|
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,190,488 A | 2/1980 | Winters |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,560,435 A | 12/1985 | Brown et al. |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Katagiri et al. |
| 4,880,493 A | 11/1989 | Ashby et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,040 A | 1/1995 | Sun et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |

| | | | | | | | |
|---|---|---|---|---|---|---|---|
| 5,567,334 | A | 10/1996 | Baker et al. | 6,055,090 | A * | 4/2000 | Miles ................. 359/291 |
| 5,570,135 | A | 10/1996 | Gove et al. | 6,057,903 | A | 5/2000 | Colgan et al. |
| 5,579,149 | A | 11/1996 | Moret et al. | 6,061,075 | A | 5/2000 | Nelson et al. |
| 5,581,272 | A | 12/1996 | Conner et al. | 6,099,132 | A | 8/2000 | Kaeriyama |
| 5,583,688 | A | 12/1996 | Hornbeck | 6,100,872 | A | 8/2000 | Aratani et al. |
| 5,589,852 | A | 12/1996 | Thompson et al. | 6,113,239 | A | 9/2000 | Sampsell et al. |
| 5,597,736 | A | 1/1997 | Sampsell | 6,115,326 | A | 9/2000 | Puma et al. |
| 5,600,383 | A | 2/1997 | Hornbeck | 6,147,790 | A | 11/2000 | Meier et al. |
| 5,602,671 | A | 2/1997 | Hornbeck | 6,158,156 | A | 12/2000 | Patrick |
| 5,606,441 | A | 2/1997 | Florence et al. | 6,160,833 | A | 12/2000 | Floyd et al. |
| 5,608,468 | A | 3/1997 | Gove et al. | 6,165,890 | A * | 12/2000 | Kohl et al. ................. 438/619 |
| 5,610,438 | A | 3/1997 | Wallace et al. | 6,166,422 | A | 12/2000 | Qian et al. |
| 5,610,624 | A | 3/1997 | Bhuva | 6,180,428 | B1 | 1/2001 | Peeters et al. |
| 5,610,625 | A | 3/1997 | Sampsell | 6,194,323 | B1 | 2/2001 | Downey et al. |
| 5,619,059 | A * | 4/1997 | Li et al. ................. 257/431 | 6,195,196 | B1 | 2/2001 | Kimura et al. |
| 5,619,365 | A | 4/1997 | Rhoads et al. | 6,201,633 | B1 | 3/2001 | Peeters et al. |
| 5,619,366 | A | 4/1997 | Rhoads et al. | 6,204,080 | B1 | 3/2001 | Hwang |
| 5,622,814 | A | 4/1997 | Miyata et al. | 6,215,221 | B1 | 4/2001 | Cabuz et al. |
| 5,629,790 | A | 5/1997 | Neukermans et al. | 6,232,936 | B1 | 5/2001 | Gove et al. |
| 5,633,652 | A | 5/1997 | Kanbe et al. | 6,243,149 | B1 | 6/2001 | Swanson et al. |
| 5,636,052 | A | 6/1997 | Arney et al. | 6,246,398 | B1 | 6/2001 | Koo |
| 5,636,185 | A | 6/1997 | Brewer et al. | 6,249,039 | B1 | 6/2001 | Harvey et al. |
| 5,638,084 | A | 6/1997 | Kalt | 6,282,010 | B1 | 8/2001 | Sulzbach et al. |
| 5,638,946 | A | 6/1997 | Zavracky | 6,284,560 | B1 | 9/2001 | Jech et al. |
| 5,641,391 | A | 6/1997 | Hunter et al. | 6,288,472 | B1 | 9/2001 | Cabuz et al. |
| 5,646,768 | A | 7/1997 | Kaeiyama | 6,295,154 | B1 | 9/2001 | Laor et al. |
| 5,647,819 | A | 7/1997 | Fujita et al. | 6,297,072 | B1 | 10/2001 | Tilmans et al. |
| 5,650,834 | A | 7/1997 | Nakagawa et al. | 6,323,982 | B1 | 11/2001 | Hornbeck |
| 5,650,881 | A | 7/1997 | Hornbeck | 6,327,071 | B1 | 12/2001 | Kimura et al. |
| 5,654,741 | A | 8/1997 | Sampsell et al. | 6,329,297 | B1 | 12/2001 | Balish et al. |
| 5,657,099 | A | 8/1997 | Doherty et al. | 6,333,556 | B1 * | 12/2001 | Juengling et al. ........... 257/758 |
| 5,659,374 | A | 8/1997 | Gale, Jr. et al. | 6,335,831 | B2 | 1/2002 | Kowarz et al. |
| 5,665,997 | A | 9/1997 | Weaver et al. | 6,351,329 | B1 | 2/2002 | Greywall |
| 5,673,139 | A | 9/1997 | Johnson | 6,356,254 | B1 | 3/2002 | Kimura |
| 5,674,757 | A | 10/1997 | Kim | 6,359,673 | B1 | 3/2002 | Stephenson |
| 5,683,591 | A | 11/1997 | Offenberg | 6,376,787 | B1 | 4/2002 | Martin et al. |
| 5,703,710 | A | 12/1997 | Brinkman et al. | 6,377,233 | B2 | 4/2002 | Colgan et al. |
| 5,706,022 | A | 1/1998 | Hato | 6,391,675 | B1 | 5/2002 | Ehmke et al. |
| 5,710,656 | A | 1/1998 | Goosen | 6,392,233 | B1 | 5/2002 | Channin et al. |
| 5,719,068 | A | 2/1998 | Suzawa et al. | 6,392,781 | B1 | 5/2002 | Kim et al. |
| 5,726,480 | A | 3/1998 | Pister | 6,407,851 | B1 | 6/2002 | Islam et al. |
| 5,739,945 | A | 4/1998 | Tayebati | 6,447,126 | B1 | 9/2002 | Hornbeck |
| 5,745,193 | A | 4/1998 | Urbanus et al. | 6,448,622 | B1 | 9/2002 | Franke et al. |
| 5,745,281 | A | 4/1998 | Yi et al. | 6,452,465 | B1 | 9/2002 | Brown et al. |
| 5,771,116 | A | 6/1998 | Miller et al. | 6,456,420 | B1 | 9/2002 | Goodwin-Johansson |
| 5,784,190 | A | 7/1998 | Worley | 6,465,320 | B1 | 10/2002 | McNeil et al. |
| 5,784,212 | A | 7/1998 | Hornbeck | 6,465,355 | B1 | 10/2002 | Horsley |
| 5,793,504 | A | 8/1998 | Stoll | 6,466,354 | B1 | 10/2002 | Gudeman |
| 5,808,780 | A | 9/1998 | McDonald | 6,466,358 | B2 | 10/2002 | Tew |
| 5,818,095 | A | 10/1998 | Sampsell | 6,473,274 | B1 | 10/2002 | Maimone et al. |
| 5,822,110 | A | 10/1998 | Dabbaj | 6,480,177 | B2 | 11/2002 | Doherty et al. |
| 5,822,170 | A | 10/1998 | Cabuz et al. | 6,496,122 | B2 | 12/2002 | Sampsell |
| 5,824,608 | A | 10/1998 | Gotoch et al. | 6,513,911 | B1 | 2/2003 | Ozaki et al. |
| 5,825,528 | A | 10/1998 | Goosen | 6,522,801 | B1 | 2/2003 | Aksyuk et al. |
| 5,835,255 | A | 11/1998 | Miles | 6,531,945 | B1 | 3/2003 | Ahn et al. |
| 5,838,484 | A | 11/1998 | Goossen et al. | 6,537,427 | B1 | 3/2003 | Raina et al. |
| 5,842,088 | A | 11/1998 | Thompson | 6,545,335 | B1 | 4/2003 | Chua et al. |
| 5,867,302 | A | 2/1999 | Fleming et al. | 6,548,908 | B2 | 4/2003 | Chua et al. |
| 5,896,796 | A * | 4/1999 | Chih ................. 83/181 | 6,549,338 | B1 | 4/2003 | Wolverton et al. |
| 5,912,758 | A | 6/1999 | Knipe et al. | 6,552,840 | B2 | 4/2003 | Knipe |
| 5,943,158 | A | 8/1999 | Ford et al. | 6,574,033 | B1 | 6/2003 | Chui et al. |
| 5,959,763 | A | 9/1999 | Bozler et al. | 6,577,785 | B1 | 6/2003 | Spahn et al. |
| 5,967,163 | A | 10/1999 | Pan et al. | 6,589,625 | B1 | 7/2003 | Kothari et al. |
| 5,972,193 | A | 10/1999 | Chou et al. | 6,600,201 | B2 | 7/2003 | Hartwell et al. |
| 5,976,902 | A | 11/1999 | Shih | 6,602,791 | B2 | 8/2003 | Ouellet et al. |
| 5,986,796 | A * | 11/1999 | Miles ................. 359/260 | 6,606,175 | B1 | 8/2003 | Sampsell et al. |
| 6,008,123 | A | 12/1999 | Kook et al. | 6,608,268 | B1 | 8/2003 | Goldsmith |
| 6,016,693 | A | 1/2000 | Viani et al. | 6,610,440 | B1 | 8/2003 | LaFollette et al. |
| 6,028,690 | A | 2/2000 | Carter et al. | 6,618,187 | B2 | 9/2003 | Pilossof |
| 6,031,653 | A | 2/2000 | Wang | 6,625,047 | B2 | 9/2003 | Coleman, Jr. |
| 6,038,056 | A | 3/2000 | Florence et al. | 6,630,786 | B2 | 10/2003 | Cummings et al. |
| 6,040,937 | A | 3/2000 | Miles | 6,632,698 | B2 | 10/2003 | Ives |
| 6,049,317 | A | 4/2000 | Thompson et al. | 6,635,919 | B1 | 10/2003 | Melendez et al. |

| | | | | | | |
|---|---|---|---|---|---|---|
| 6,642,913 B1 | 11/2003 | Kimura et al. | | 7,446,926 B2 | 11/2008 | Sampsell |
| 6,643,069 B2 | 11/2003 | Dewald | | 7,492,502 B2 | 2/2009 | Chui et al. |
| 6,650,455 B2 | 11/2003 | Miles | | 7,547,565 B2 | 6/2009 | Lin et al. |
| 6,657,832 B2 | 12/2003 | Williams et al. | | 2001/0003487 A1 | 6/2001 | Miles |
| 6,666,561 B1 | 12/2003 | Blakley | | 2001/0026951 A1 | 10/2001 | Vergani et al. |
| 6,674,090 B1 | 1/2004 | Chua et al. | | 2001/0040649 A1 | 11/2001 | Ozaki |
| 6,674,562 B1 | 1/2004 | Miles et al. | | 2001/0040675 A1 | 11/2001 | True et al. |
| 6,674,563 B2 | 1/2004 | Chui et al. | | 2002/0003400 A1 | 1/2002 | Lee |
| 6,680,792 B2 | 1/2004 | Miles | | 2002/0014579 A1 | 2/2002 | Dunfield |
| 6,687,896 B1 | 3/2004 | Miles | | 2002/0015215 A1 | 2/2002 | Miles |
| 6,710,908 B2 | 3/2004 | Miles et al. | | 2002/0021485 A1 | 2/2002 | Pilossof |
| 6,713,235 B1 * | 3/2004 | Ide et al. ............... 430/313 | | 2002/0024711 A1 | 2/2002 | Miles |
| 6,720,267 B1 | 4/2004 | Chen et al. | | 2002/0027636 A1 | 3/2002 | Yamada |
| 6,736,987 B1 | 5/2004 | Cho | | 2002/0036304 A1 | 3/2002 | Ehmke et al. |
| 6,741,377 B2 | 5/2004 | Miles | | 2002/0054424 A1 | 5/2002 | Miles |
| 6,741,384 B1 | 5/2004 | Martin et al. | | 2002/0055253 A1 | 5/2002 | Rudhard |
| 6,741,503 B1 | 5/2004 | Farris et al. | | 2002/0071169 A1 | 6/2002 | Bowers et al. |
| 6,743,570 B2 * | 6/2004 | Harnett et al. ............. 430/296 | | 2002/0075555 A1 | 6/2002 | Miles |
| 6,747,785 B2 | 6/2004 | Chen et al. | | 2002/0086455 A1 | 7/2002 | Franosch et al. |
| 6,747,800 B1 | 6/2004 | Lin | | 2002/0110948 A1 | 8/2002 | Huang et al. |
| 6,756,317 B2 | 6/2004 | Sniegowski et al. | | 2002/0117728 A1 | 8/2002 | Brosnihan et al. |
| 6,768,097 B1 | 7/2004 | Viktorovitch et al. | | 2002/0126364 A1 | 9/2002 | Miles |
| 6,775,174 B2 | 8/2004 | Huffman et al. | | 2002/0135857 A1 | 9/2002 | Fitzpatrick et al. |
| 6,778,155 B2 | 8/2004 | Doherty et al. | | 2002/0137072 A1 | 9/2002 | Mirkin et al. |
| 6,778,306 B2 | 8/2004 | Sniegowski et al. | | 2002/0149828 A1 | 10/2002 | Miles |
| 6,782,166 B1 | 8/2004 | Grote et al. | | 2002/0168136 A1 | 11/2002 | Atia et al. |
| 6,794,119 B2 | 9/2004 | Miles | | 2003/0003682 A1 | 1/2003 | Moll et al. |
| 6,806,110 B2 | 10/2004 | Lester et al. | | 2003/0006468 A1 | 1/2003 | Ma et al. |
| 6,811,267 B1 | 11/2004 | Allen et al. | | 2003/0012866 A1 * | 1/2003 | Harnett et al. ............. 427/2.11 |
| 6,812,482 B2 | 11/2004 | Fleming et al. | | 2003/0029831 A1 * | 2/2003 | Kawase ............... 216/27 |
| 6,819,469 B1 | 11/2004 | Koba | | 2003/0036215 A1 * | 2/2003 | Reid ............... 438/52 |
| 6,822,628 B2 | 11/2004 | Dunphy et al. | | 2003/0043157 A1 | 3/2003 | Miles |
| 6,829,132 B2 | 12/2004 | Martin et al. | | 2003/0054588 A1 | 3/2003 | Patel et al. |
| 6,853,129 B1 | 2/2005 | Cummings et al. | | 2003/0062186 A1 | 4/2003 | Boroson et al. |
| 6,855,610 B2 | 2/2005 | Tung et al. | | 2003/0072070 A1 | 4/2003 | Miles |
| 6,859,218 B1 | 2/2005 | Luman et al. | | 2003/0090350 A1 | 5/2003 | Feng et al. |
| 6,861,277 B1 | 3/2005 | Monroe et al. | | 2003/0104693 A1 * | 6/2003 | Siegel et al. ............... 438/680 |
| 6,862,022 B2 | 3/2005 | Slupe | | 2003/0112096 A1 | 6/2003 | Potter |
| 6,862,029 B1 | 3/2005 | D'Souza et al. | | 2003/0138213 A1 | 7/2003 | Jiin et al. |
| 6,867,896 B2 | 3/2005 | Miles | | 2003/0152872 A1 | 8/2003 | Miles |
| 6,870,581 B2 | 3/2005 | Li et al. | | 2003/0201784 A1 | 10/2003 | Potter |
| 6,870,654 B2 | 3/2005 | Lin et al. | | 2003/0202264 A1 | 10/2003 | Weber et al. |
| 6,882,458 B2 | 4/2005 | Lin et al. | | 2003/0202265 A1 | 10/2003 | Reboa et al. |
| 6,882,461 B2 | 4/2005 | Tsai et al. | | 2003/0202266 A1 | 10/2003 | Ring et al. |
| 6,912,022 B2 | 6/2005 | Lin et al. | | 2003/0231373 A1 | 12/2003 | Kowarz et al. |
| 6,952,303 B2 | 10/2005 | Lin et al. | | 2004/0010115 A1 | 1/2004 | Sotzing |
| 6,952,304 B2 | 10/2005 | Mushika et al. | | 2004/0027636 A1 | 2/2004 | Miles |
| 6,953,702 B2 | 10/2005 | Miller et al. | | 2004/0027701 A1 | 2/2004 | Ishikawa |
| 6,958,847 B2 | 10/2005 | Lin | | 2004/0028849 A1 | 2/2004 | Stark et al. |
| 6,972,891 B2 | 12/2005 | Patel et al. | | 2004/0035821 A1 | 2/2004 | Doan et al. |
| 6,982,820 B2 | 1/2006 | Tsai | | 2004/0038513 A1 * | 2/2004 | Kohl et al. ............... 438/619 |
| 6,995,890 B2 | 2/2006 | Lin | | 2004/0051929 A1 | 3/2004 | Sampsell et al. |
| 6,999,225 B2 | 2/2006 | Lin | | 2004/0053434 A1 | 3/2004 | Bruner |
| 6,999,236 B2 * | 2/2006 | Lin et al. ............... 359/585 | | 2004/0058531 A1 | 3/2004 | Hsieh et al. |
| 7,008,812 B1 | 3/2006 | Carley | | 2004/0058532 A1 | 3/2004 | Miles et al. |
| 7,012,726 B1 | 3/2006 | Miles | | 2004/0061543 A1 | 4/2004 | Nam et al. |
| 7,027,202 B1 | 4/2006 | Hunter et al. | | 2004/0063322 A1 | 4/2004 | Yang |
| 7,041,224 B2 | 5/2006 | Patel et al. | | 2004/0080807 A1 | 4/2004 | Chen et al. |
| 7,041,571 B2 * | 5/2006 | Strane ............... 438/411 | | 2004/0080832 A1 | 4/2004 | Singh |
| 7,049,164 B2 | 5/2006 | Bruner | | 2004/0087086 A1 | 5/2004 | Lee |
| 7,052,821 B2 | 5/2006 | Kohl et al. | | 2004/0100677 A1 * | 5/2004 | Huibers et al. ............... 359/290 |
| 7,078,293 B2 * | 7/2006 | Lin et al. ............... 438/253 | | 2004/0124073 A1 | 7/2004 | Pilans et al. |
| 7,110,158 B2 | 9/2006 | Miles | | 2004/0124483 A1 | 7/2004 | Partridge et al. |
| 7,119,945 B2 | 10/2006 | Kothari et al. | | 2004/0124495 A1 * | 7/2004 | Chen et al. ............... 257/522 |
| 7,123,216 B1 | 10/2006 | Miles | | 2004/0125281 A1 | 7/2004 | Lin et al. |
| 7,145,213 B1 * | 12/2006 | Ebel et al. ............... 257/414 | | 2004/0125282 A1 | 7/2004 | Lin et al. |
| 7,172,915 B2 * | 2/2007 | Lin et al. ............... 438/38 | | 2004/0125536 A1 | 7/2004 | Arney et al. |
| 7,193,768 B2 * | 3/2007 | Lin ............... 359/291 | | 2004/0132243 A1 * | 7/2004 | Kurosawa et al. ............ 438/200 |
| 7,198,973 B2 | 4/2007 | Lin et al. | | 2004/0136076 A1 | 7/2004 | Tayebati |
| 7,221,495 B2 | 5/2007 | Miles et al. | | 2004/0145049 A1 | 7/2004 | McKinnell et al. |
| 7,256,107 B2 | 8/2007 | Takeuchi et al. | | 2004/0145811 A1 * | 7/2004 | Lin et al. ............... 359/585 |
| 7,259,865 B2 * | 8/2007 | Cummings et al. ............... 356/503 | | 2004/0147056 A1 | 7/2004 | McKinnell et al. |
| 7,289,256 B2 * | 10/2007 | Cummings et al. ............... 359/238 | | 2004/0147198 A1 * | 7/2004 | Lin et al. ............... 445/24 |

| Publication No. | Date | Inventor |
|---|---|---|
| 2004/0148009 A1 | 7/2004 | Buzzard |
| 2004/0150869 A1* | 8/2004 | Kasai ........................ 359/290 |
| 2004/0160143 A1 | 8/2004 | Shreeve et al. |
| 2004/0163758 A1* | 8/2004 | Kagan et al. ................ 156/230 |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0191946 A1 | 9/2004 | Patel et al. |
| 2004/0197526 A1 | 10/2004 | Mehta |
| 2004/0207897 A1 | 10/2004 | Lin |
| 2004/0207898 A1 | 10/2004 | Lin et al. |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217264 A1 | 11/2004 | Wood et al. |
| 2004/0217378 A1 | 11/2004 | Martin et al. |
| 2004/0217919 A1 | 11/2004 | Pichl et al. |
| 2004/0218251 A1 | 11/2004 | Pichl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0014374 A1 | 1/2005 | Partridge et al. |
| 2005/0020089 A1 | 1/2005 | Shi et al. |
| 2005/0024557 A1 | 2/2005 | Lin |
| 2005/0034822 A1* | 2/2005 | Kim et al. ........................ 159/5 |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0045276 A1 | 3/2005 | Patel et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0098840 A1 | 5/2005 | Fuertsch et al. |
| 2005/0118832 A1 | 6/2005 | Korzenski et al. |
| 2005/0124135 A1 | 6/2005 | Ayazi et al. |
| 2005/0146401 A1* | 7/2005 | Tilmans et al. .............. 333/187 |
| 2005/0168849 A1 | 8/2005 | Lin |
| 2005/0170670 A1* | 8/2005 | King et al. ................. 438/800 |
| 2005/0195462 A1 | 9/2005 | Lin |
| 2005/0195467 A1 | 9/2005 | Kothari et al. |
| 2005/0202649 A1 | 9/2005 | Hung et al. |
| 2005/0206991 A1 | 9/2005 | Chui et al. |
| 2006/0066511 A1* | 3/2006 | Chui .......................... 345/32 |
| 2006/0066932 A1 | 3/2006 | Chui |
| 2006/0066935 A1 | 3/2006 | Cummings et al. |
| 2006/0067646 A1* | 3/2006 | Chui .......................... 385/147 |
| 2006/0076311 A1* | 4/2006 | Tung et al. ................... 216/24 |
| 2006/0077152 A1* | 4/2006 | Chui et al. ................... 345/85 |
| 2006/0077502 A1* | 4/2006 | Tung et al. ................. 359/237 |
| 2006/0077503 A1 | 4/2006 | Palmateer et al. |
| 2006/0077529 A1 | 4/2006 | Chui et al. |
| 2006/0119922 A1 | 6/2006 | Faase et al. |
| 2006/0177950 A1 | 8/2006 | Lin et al. |
| 2006/0256420 A1 | 11/2006 | Miles et al. |
| 2006/0257070 A1* | 11/2006 | Lin et al. ..................... 385/17 |
| 2007/0042521 A1* | 2/2007 | Yama ........................ 438/48 |
| 2007/0111533 A1 | 5/2007 | Korzenski et al. |
| 2007/0269748 A1 | 11/2007 | Miles |
| 2008/0026328 A1* | 1/2008 | Miles ........................ 430/313 |
| 2008/0068699 A1 | 3/2008 | Miles |
| 2009/0022884 A1 | 1/2009 | Chui et al. |
| 2009/0323168 A1 | 12/2009 | Miles et al. |

FOREIGN PATENT DOCUMENTS

| | | |
|---|---|---|
| CN | 092109265 | 11/2003 |
| DE | 199 38 072 | 3/2000 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0 788 005 | 8/1997 |
| EP | 0878824 A2 | 11/1998 |
| EP | 1197778 | 4/2002 |
| EP | 1209738 | 5/2002 |
| EP | 1258860 A1 | 11/2002 |
| EP | 1 452 481 A | 9/2004 |
| JP | 49-004993 | 1/1974 |
| JP | 405275401 A | 10/1993 |
| JP | 06-350105 | 12/1994 |
| JP | 07-098326 | 4/1995 |
| JP | 07-060844 | 7/1995 |
| JP | 10-020328 | 1/1998 |
| JP | 10500224 | 1/1998 |
| JP | 10-148644 | 6/1998 |
| JP | 10-209176 | 8/1998 |
| JP | 10-267658 | 10/1998 |
| JP | 11211999 A | 8/1999 |
| JP | 11243214 | 9/1999 |
| JP | 2000-40831 A | 2/2000 |
| JP | 2001-085519 | 3/2001 |
| JP | 2002-0287047 | 3/2001 |
| JP | 2002 062493 | 2/2002 |
| JP | 2002-207182 | 7/2002 |
| JP | 2002-243937 | 8/2002 |
| JP | 2002-270575 | 9/2002 |
| JP | 2002-328313 | 11/2002 |
| JP | 2002-355800 | 12/2002 |
| JP | 2003001598 A | 1/2003 |
| JP | 2004-102022 A | 4/2004 |
| JP | 2004-133281 | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 * | 5/1991 |
| WO | WO 91/05284 | 4/1991 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 01/63657 | 8/2001 |
| WO | WO 02/24570 | 3/2002 |
| WO | WO03007049 A1 | 1/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 2004/041918 | 5/2004 |
| WO | WO 2004/055885 | 7/2004 |
| WO | WO 2004/079056 | 9/2004 |
| WO | WO 2005/019899 A1 | 3/2005 |

| | | |
|---|---|---|
| WO | WO 2005/061378 | 7/2005 |
| WO | WO 2005/085932 A | 9/2005 |

OTHER PUBLICATIONS

Lieberman, "MEMS Display Looks to Give PDAs Sharper Image," EE Times (Feb. 11, 1997).
Lieberman, "Microbridges at Heart of New MEMS Displays" EE Times (Apr. 24, 1997).
Maboudian, et al. Critical Review: Adhesion in Surface Micromechanical Structures: J. Vac. Sci Techno. B 15(1) Jan./Feb. 1997. pp. 1-20.
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Penta Vacuum MEMS Etcher Specifications, http://www.pentavacuum.com/memes.htm.
Science and Technology, The Economist, pp. 89-90, (May 1999).
Search Report PCT/US05/030033 and Written Opinion.
Search Report PCT/US05/030902.
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and written opinion PCT/US05/032647.
Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).
Thin Film Transistors- Materials and Processes -vol. 1 Amorphous Silicon Thin Film Transistors ed. Yue Kuo, Kluwer Academic Publishers, Boston (2004).
Xactix Xetch X Specifications, http://xactix.com/Xtech X3specs.htm. Jan. 5, 2005.
XactiX Xetch Product information.
Akasaka, "Three-Dimensional IC Trends," Proceedings of IEEE, vol. 74, No. 12, pp. 1703-1714, (Dec. 1986).
Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.

Howard et al., "Nanometer-Scale Fabrication Techniques," VLSI Electronics: Microstructure Science, vol. 5, pp. 145-153 and pp. 166-173 (1982).
Ibbotson et al., "Comparison of XcF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573. (date unknown).
Jerman ct al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim ct al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. (1996).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (Jan. 25, 2006).
PCT/US05/031693 International Search Report.
PCT/US05/032331 International Search Report (Apr. 7, 2006).
PCT/US05/033558 Partial International Search Report (Feb. 24, 2006).
PCT/US2004/035820 International Search Report and Written Opinion (Apr. 11, 2005).
PCT/US96/17731 Search Report.
Raley et al., "A Fabry-Perot Microinterferometer for Visible Wavelengths," IEEE Solid-State Sensor and Actuator Workshop, Jun. 1992, Hilton Head, SC.
Schnakenberg Cl al., "TMAHW Etchants for Silicon Micromachining," 1991 International Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachincd Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Partial International Search Results in PCT/US2006/045925 filed on Nov. 30, 2006.

ISR and WO for PCT/US06/045925 filed Nov. 30, 2006.

Yao et al., BrF3 dry release technology for large freestanding parylene microstructures and electrostatic actuators, Sensors and Actuators A, vol. 97-98, pp. 771-775, Apr. 2002.

IPRP for PCT/US06/045925 filed Nov. 30, 2006.

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Austrian Search Report for EX72/2005 dated May 13, 2005.

Austrian Search Report for EX81/2005 dated May 18, 2005.

Austrian Search Report for EX170/2005 dated Jul. 6, 2005.

Austrian Search Report for EX139/2005 dated Jul. 27, 2005.

Austrian Search Report for EX144/2005 dated Aug. 11, 2005.

Bains, "Digital Paper Display Technology Holds Promise For Portables," CommsDesign EE Times (2000).

Bass, Handbook of Optics, vol. 1, Fundamentals, Techniques, and Design, Second Edition, McGraw-Hill, inc. New York pp. 2.29/2.36 (1995).

Chu, et al. "Formation and Microstructures of Anodic Aluminoa Films from Aluminum Sputtered onglass Substrate" Journal of the Electrochemical Society, 149 (7) B321-8327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Furneaux, et al. "The Formation of Controlled-porosity membranes from Anodically Oxidized Aluminium" Nature vo 337 Jan. 12, 1989, pp. 147-149.

* cited by examiner

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

US 7,795,061 B2

METHOD OF CREATING MEMS DEVICE CAVITIES BY A NON-ETCHING PROCESS

BACKGROUND

1. Field of the Invention

This invention relates to microelectromechanical systems for use as interferometric modulators. More particularly, this invention relates to systems and methods for improving the manufacture of interferometric modulators.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by a gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a method of making a MEMS device that includes depositing a polymer layer over a substrate, forming an electrically conductive layer over the polymer layer, and vaporizing at least a portion of the polymer layer to form a cavity between the substrate and the electrically conductive layer.

Another embodiment provides an unreleased MEMS device that includes a substrate, a heat-vaporizable polymer over the substrate, and an electrically conductive layer over the heat-vaporizable polymer.

Another embodiment provides a method for making an interferometric modulator that includes providing a substrate, depositing a first electrically conductive material over at least a portion of the substrate, depositing a sacrificial material over at least a portion of the first electrically conductive material, depositing an insulator over the substrate and adjacent to the sacrificial material to form a support structure, and depositing a second electrically conductive material over at least a portion of the sacrificial material, the sacrificial material being removable by heat-vaporization to thereby form a cavity between the first electrically conductive layer and the second electrically conductive layer. Another embodiment provides an unreleased interferometric modulator made by such a method.

Another embodiment provides an unreleased interferometric modulator that includes a first means for reflecting light, a second means for reflecting light, a first means for supporting the second reflecting means, and a second means for supporting the second reflecting means, where the first supporting means comprises a sacrificial material, the sacrificial material being removable by heat-vaporization to thereby form a cavity defined by the first reflecting means, the second reflecting means, and the second supporting means.

Another embodiment provides an interferometric modulator that includes a substrate, a first electrically conductive material over at least a portion of the substrate, a second electrically conductive layer separated from the first electrically conductive layer by a cavity, and a nonconductive support structure arranged over the substrate and configured to support the second electrically conductive layer. In this embodiment, at least one of the first electrically conductive layer, the second electrically conductive layer and the nonconductive support structure comprises a material that is etchable by xenon diflouride. Another embodiment provides an array of interferometric modulators that includes such an interferometric modulator. Another embodiment provides a display device that includes such an array of interferometric modulators. The display device of this embodiment further includes a processor configured to communicate with the array, the processor being configured to process image data, and a memory device configured to communicate with the processor.

These and other embodiments are described in greater detail below.

BRIEF DESCRIPTION OF THE DRAWINGS

FIGS. 1 to 13 are not to scale.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

A preferred embodiment provides methods of making interferometric modulators by using a sacrificial layer that contains a heat vaporizable polymer to form a gap between a moveable layer and a substrate.

Figure 1:
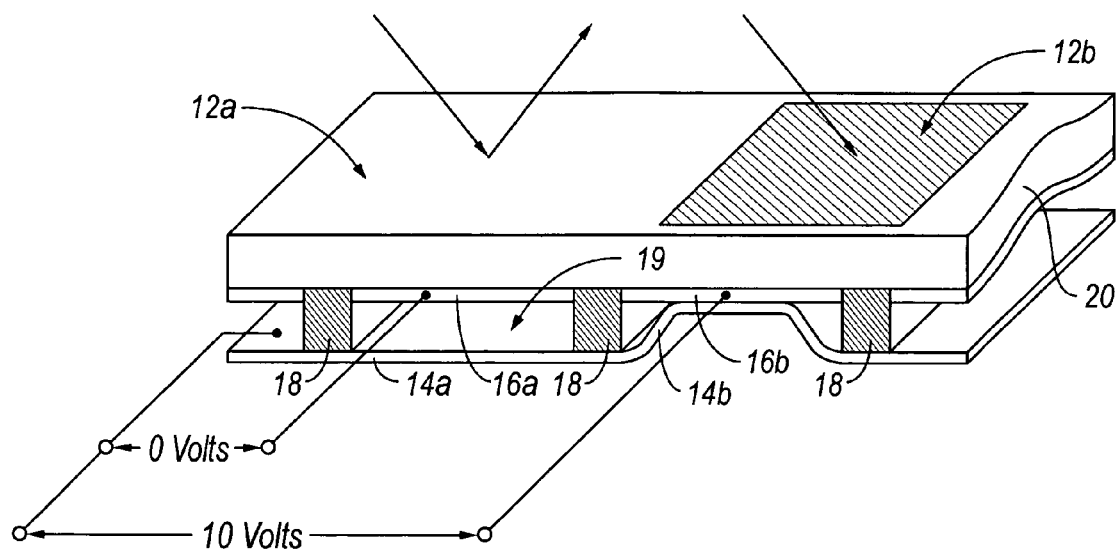
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
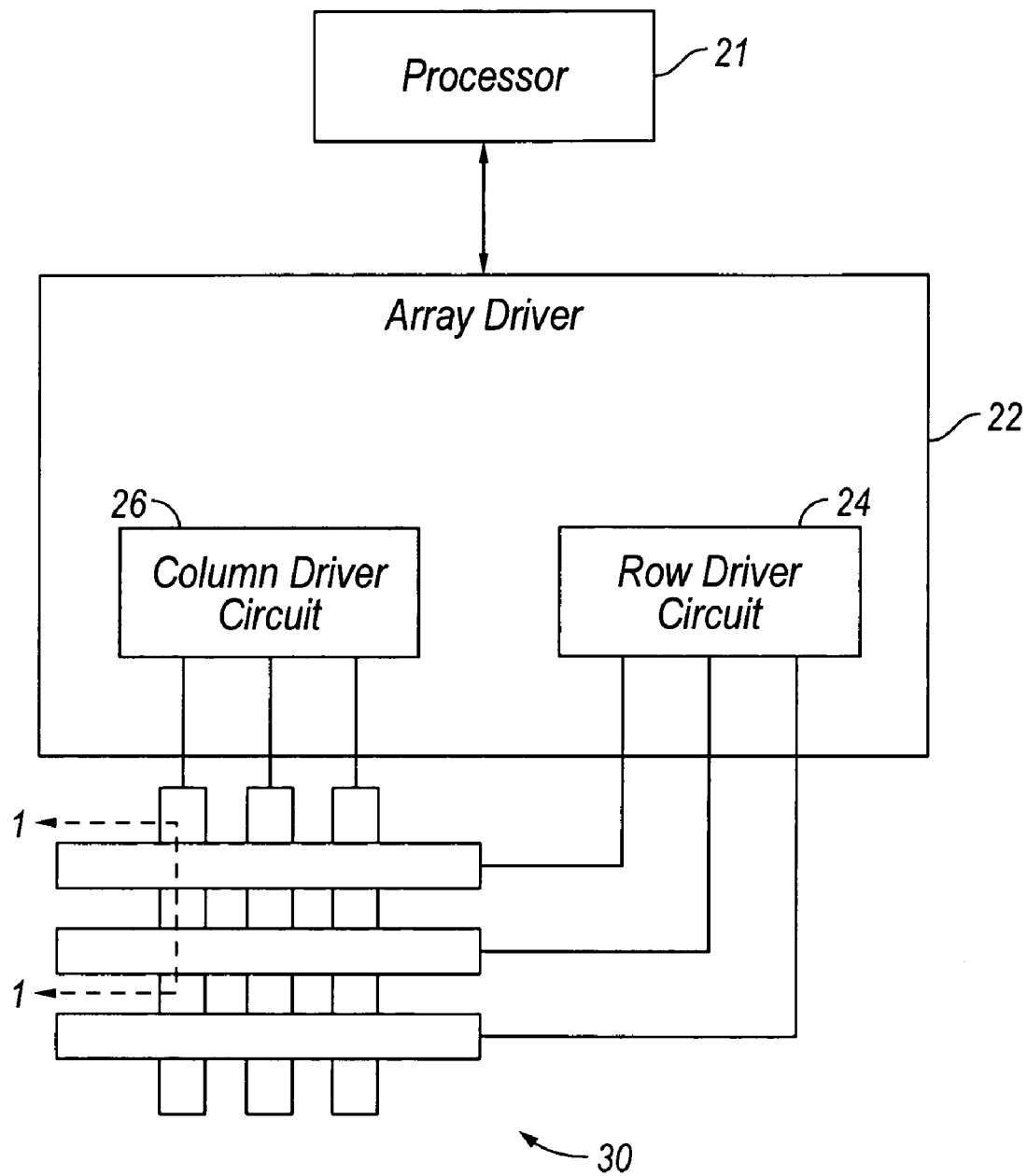
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
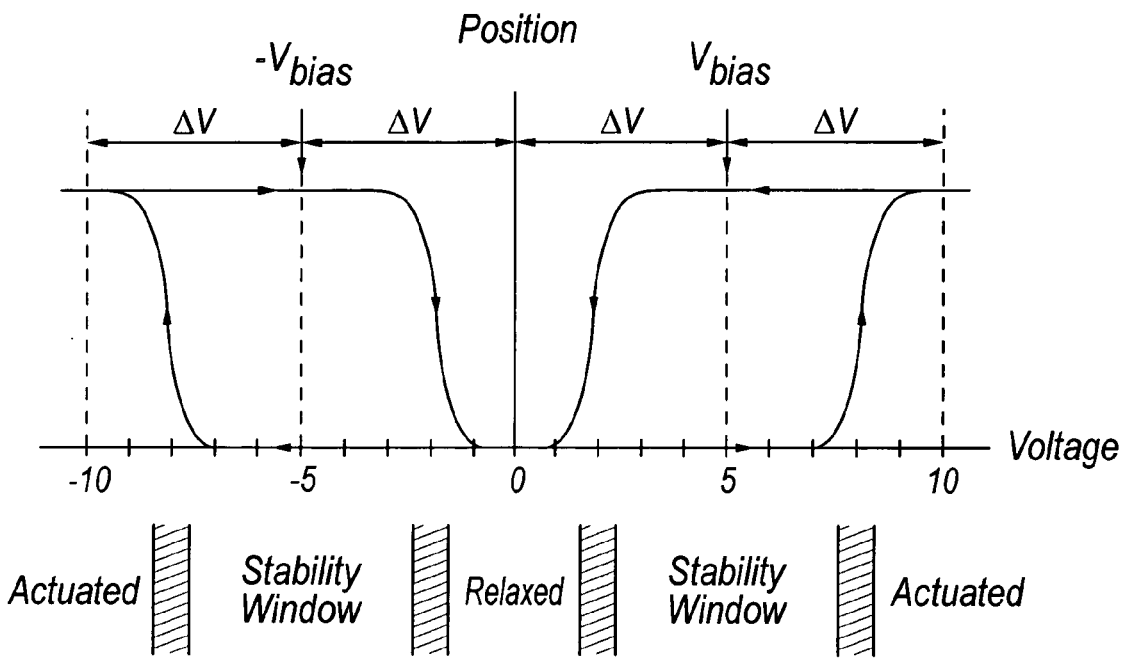
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
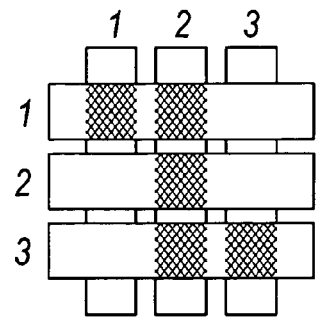
FIGS. 5A and 5B illustrate one exemplary timing diagram for row and column signals that may be used to write a frame of display data to the 3×3 interferometric modulator display of FIG. 2.
Figure 5B:
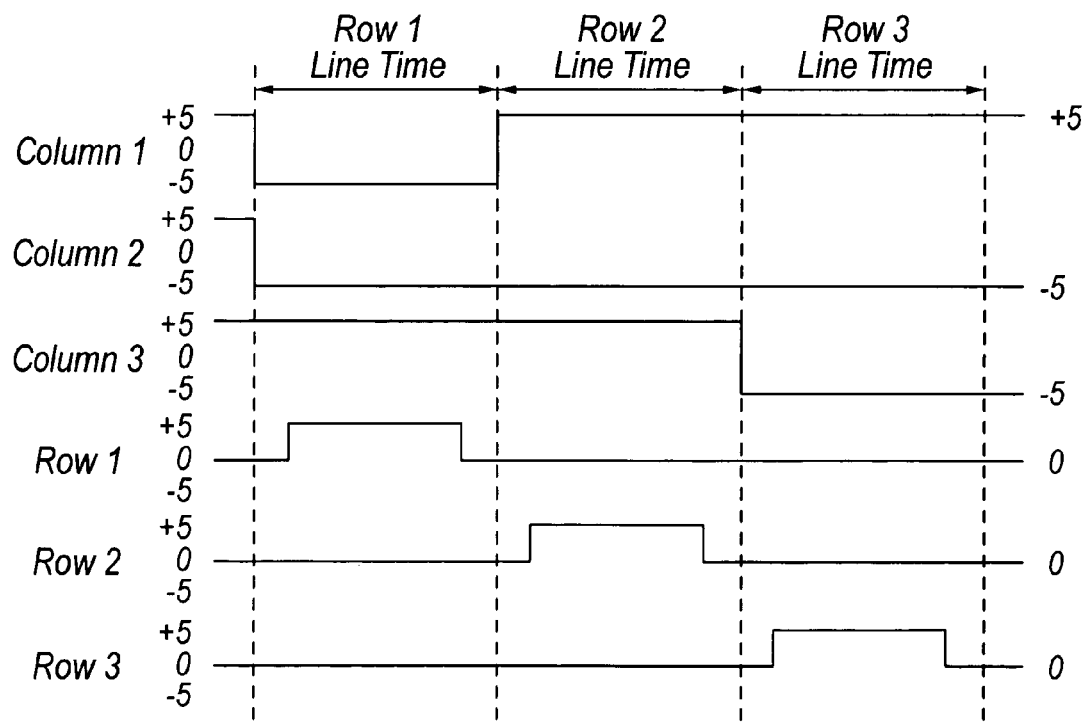

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
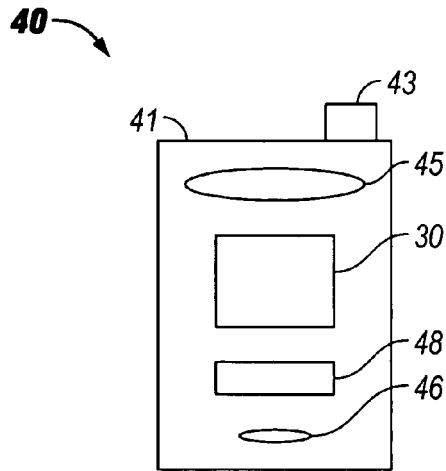
FIGS. 6A and 6B are system block diagrams illustrating an embodiment of a visual display device comprising a plurality of interferometric modulators.
Figure 6B:
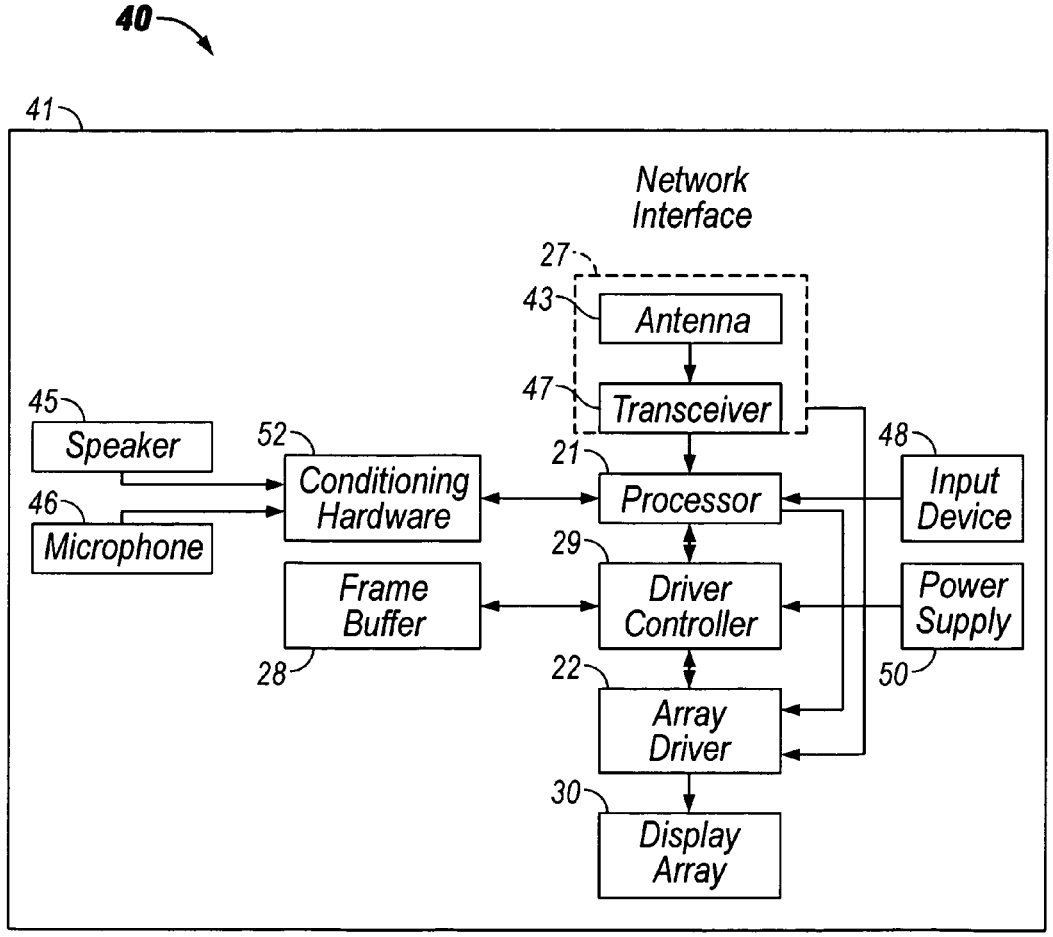

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, a microphone 46 and an input device 48. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a memory storage device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
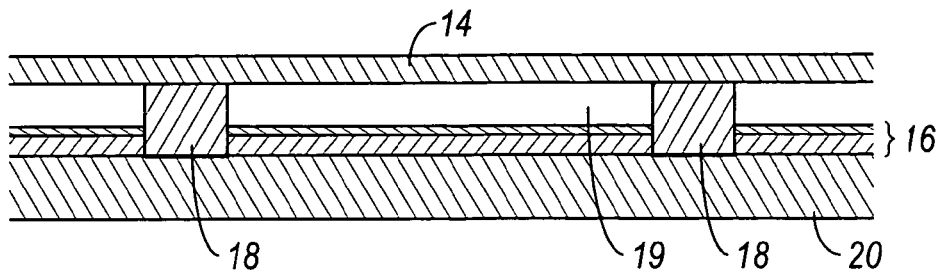
FIG. 7A is a cross section of the device of FIG. 1.
Figure 7B:
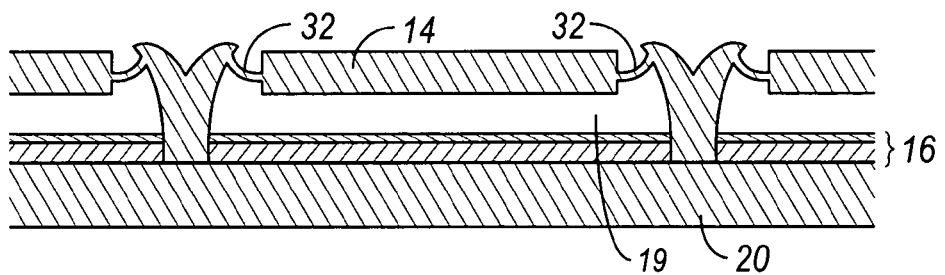
FIG. 7B is a cross section of an alternative embodiment of an interferometric modulator.
Figure 7C:
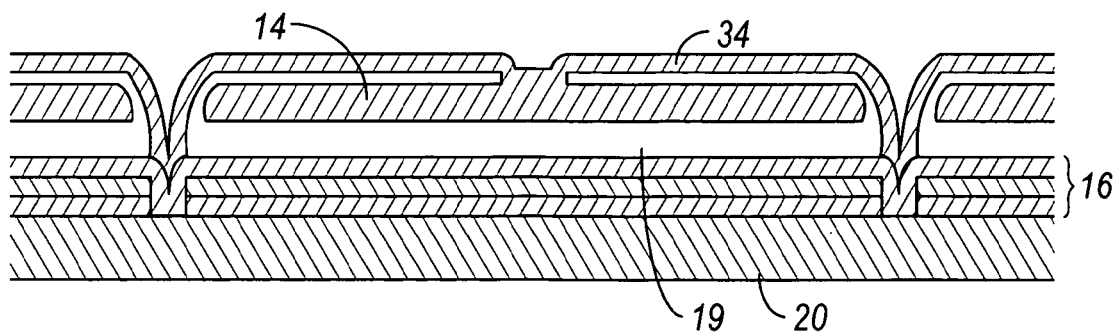
FIG. 7C is a cross section of another alternative embodiment of an interferometric modulator.
Figure 7D:
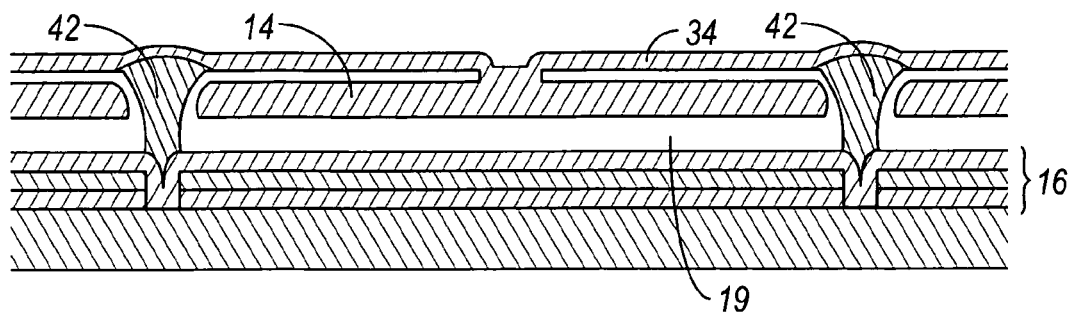
FIG. 7D is a cross section of yet another alternative embodiment of an interferometric modulator.
Figure 7E:
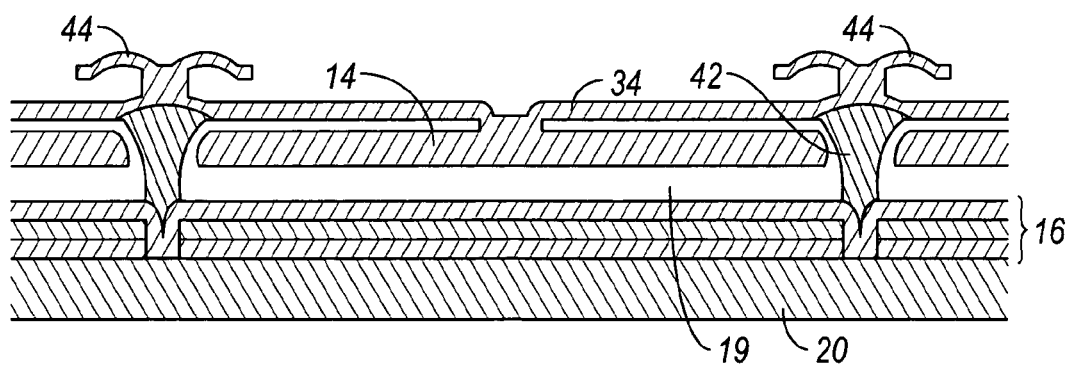
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending support structures 18. In FIG. 7B, the movable reflective layer 14 is attached to supports at the corners only, on tethers 32. In FIG. 7C, the movable reflective layer 14 is suspended from a deformable layer 34, which may comprise a flexible metal. The deformable layer 34 connects, directly or indirectly, to the substrate 20 around the perimeter of the deformable layer 34. These connections may be referred to herein as support posts. The embodiment illustrated in FIG. 7D has support structures 18 that include support post plugs 42 upon which the deformable layer 34 rests. The movable reflective layer 14 remains suspended over the cavity, as in FIGS. 7A-7C, but the deformable layer 34 does not form the support posts 18 by filling holes between the deformable layer 34 and the optical stack 16. Rather, the support posts 18 comprise a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields some portions of the interferometric modulator on the side of the reflective layer opposite the substrate 20, including the deformable layer 34 and the bus structure 44 (FIG. 7E). This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect-to the optical properties, and the structural design and materials used for the deformable layer 34 to be optimized with respect to desired mechanical properties.

Figure 8:
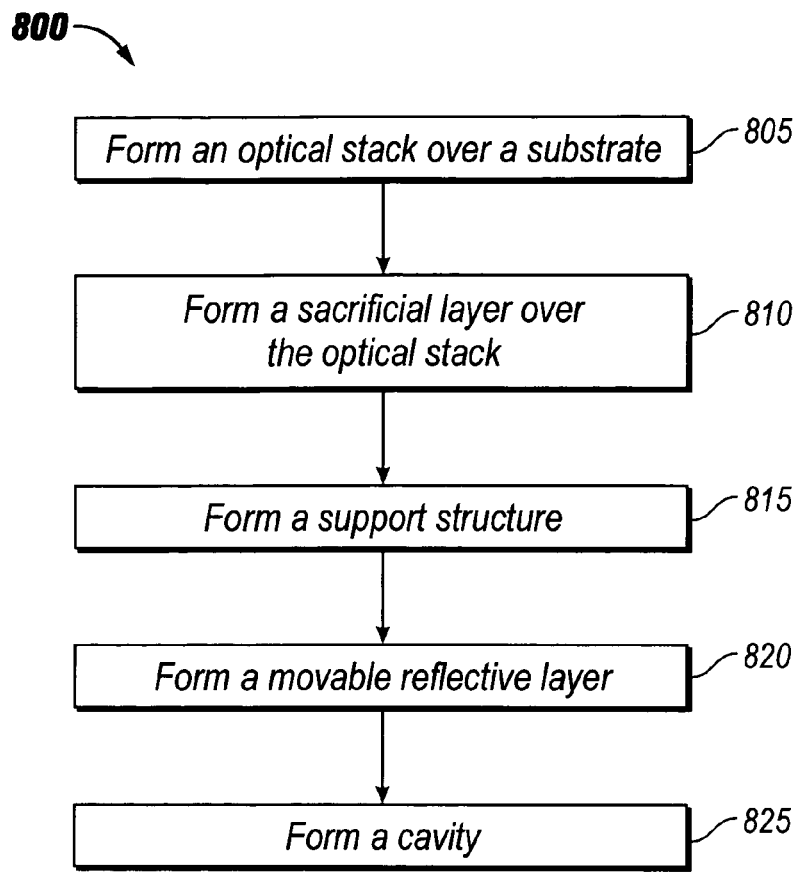
FIG. 8 is a flow diagram illustrating certain steps in an embodiment of a method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIGS. 1 and 7. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7C illustrates the lower end of the support post plugs 42 in contact with the optical stack 16.

The process 800 illustrated in FIG. 8 continues at step 820 with the formation of a movable reflective layer such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

While etching methods have been used to successfully remove sacrificial materials such as molybdenum or amorphous silicon to form cavities in MEMS devices such as interferometric modulators, there are drawbacks and disadvantages. One disadvantage of etching is that the size of the substrates that can be etched is usually small due to the environmental control requirements of the etching process including, for example, venting toxic and/or corrosive by-products, e.g., fluorine gas. Another disadvantage is that complete removal of some sacrificial materials may result in over etching and damage to neighboring structures. Such damage may be mitigated, e.g., by using an etch stop, but in some situations such additional structures may undesirably complicate the process. Another disadvantage is that use of materials that are etchable by $XeF_2$ may be limited in devices that are exposed to a $XeF_2$ etching process. Another disadvantage is that $XeF_2$ tends to be relatively expensive.

A MEMS fabrication method has now been developed that utilizes a heat vaporizable polymer as a sacrificial material. A heat vaporizable material is a solid material that vaporizes upon heating to a vaporization temperature, such that substantially all of the polymer (e.g., >95% by weight) is vaporized. The vaporization temperature range is preferably high enough such that the heat vaporizable material remains intact at normal fabrication temperatures, but low enough to avoid damaging other materials present during vaporization. In an embodiment, the heat vaporizable material is a heat vaporizable polymer. A variety of heat vaporizable polymers may be used. For example, one such heat vaporizable material is a heat-depolymerizable polycarbonate (HDP) such as poly(cyclohexene carbonate), an aliphatic polycarbonate that may be made from $CO_2$ and an epoxide, see U.S. Pat. No. 6,743,570 B2. Other HDP's may also be used.

Heat vaporization of a material, such as HDP, being used as a sacrificial material in a process for manufacturing interferometric modulators, such as process 800 illustrated in FIG. 8, may be advantageous as compared to removal of the sacrificial material using an etchant such as $XeF_2$. In an embodiment, an advantage is that the vapors given off during heating of HDP are non-toxic or less toxic than vapors given off in an etching process. This simplifies the environmental requirements of the chamber being used for removing the sacrificial material. A simple oven, or even a heated surface such as a heated plate, may be used to heat substrates to a temperature sufficient for vaporization. Use of an oven or heated plate and, in one embodiment, simplified venting requirements afford an advantage of being able to process a substantially larger glass (or temperature resistant plastic) plate than the substrates provided for in etchers. Glass plates up to about 2 meters by about 3 meters, or larger, may be processed. This size of substrate would permit the manufacture of relatively large MEMS devices, e.g., large-screen-TV sized interferometric modulator arrays. In addition, non-uniformity produced by etching may be reduced by heating instead of etching.

The use of heat vaporization may permit the use of a wider array of materials including those materials that are etchable by $XeF_2$. For example, one or more of various structures such as the electrically conductive layer, the substrate and the support structure may comprise a material that is etchable by xenon diflouride. In addition, use of etch stops (which may, in the fabrication of MEMS devices, complicate the process and increase costs) may be reduced or eliminated. The use of heat vaporization may also allow for process flexibility, which may result in the elimination of entire steps such as patterning.

Figure 9:
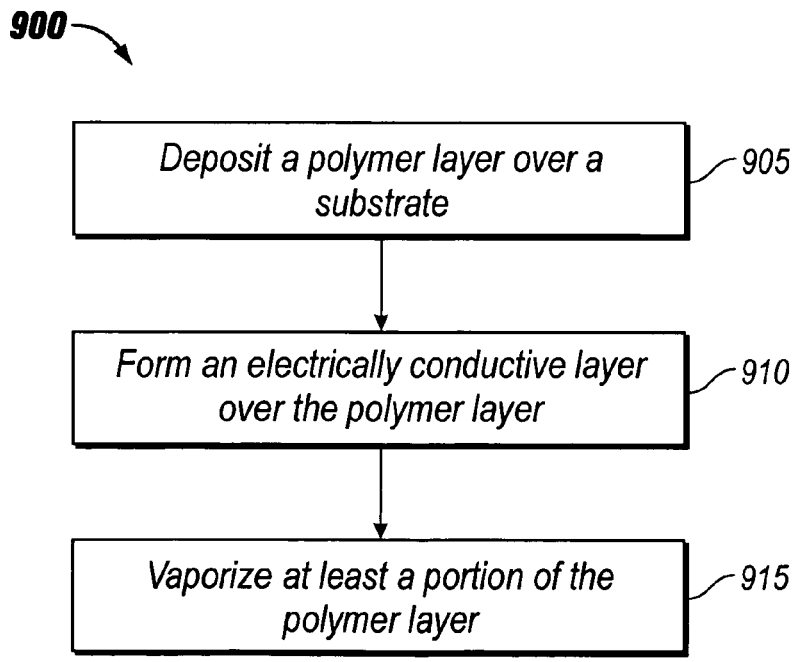
FIG. 9 is a flow diagram illustrating an embodiment of a method of making a MEMS device.
Figure 10A:
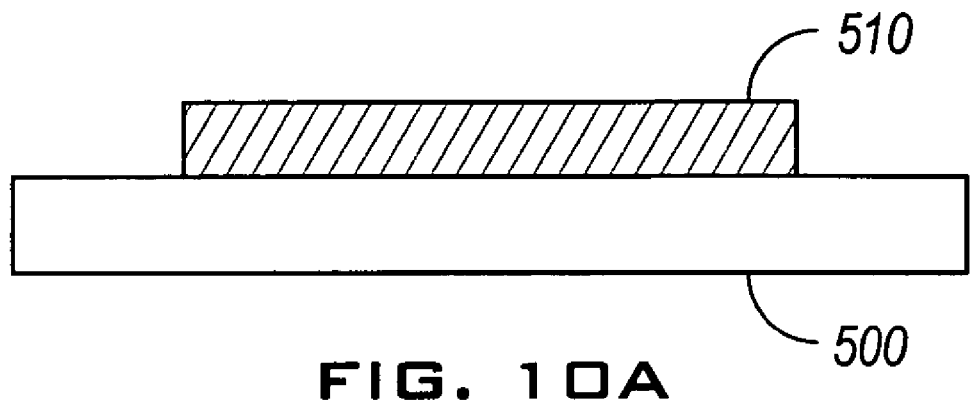
FIGS. 10a through 10c schematically illustrate an embodiment of a method for fabricating a MEMS device.
Figure 10B:
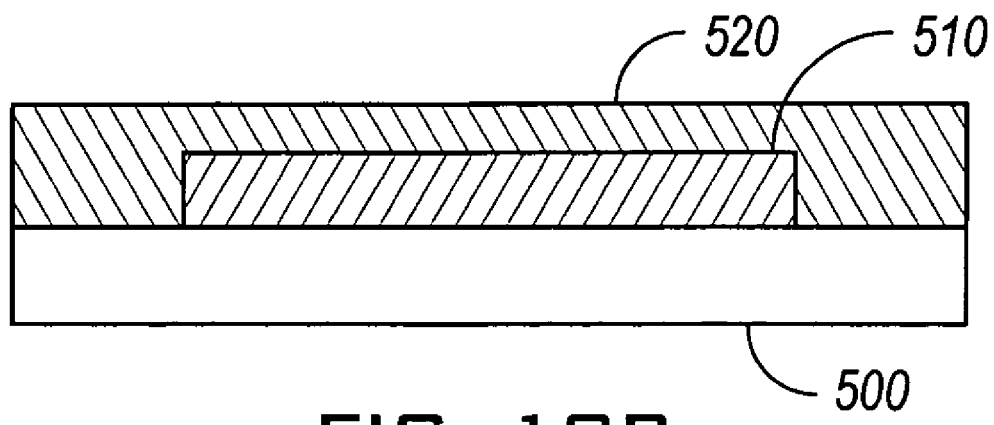
Figure 10C:
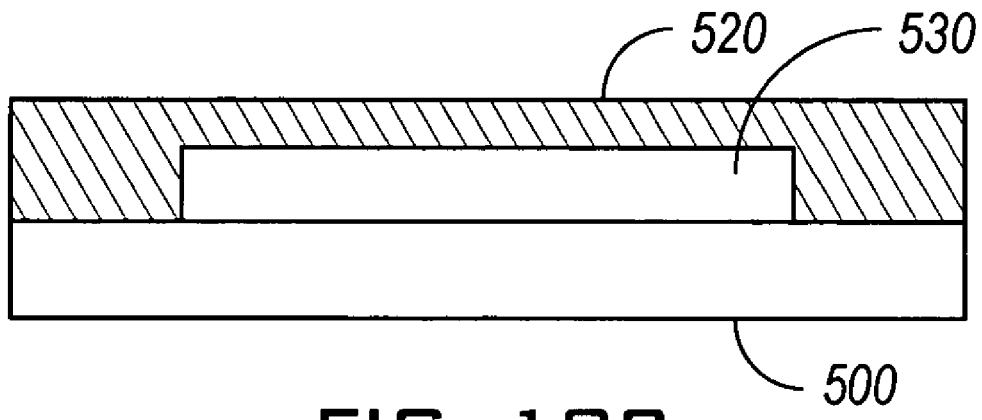

FIG. 9 is a flow diagram illustrating certain steps in an embodiment of a method of making a MEMS device. Such steps may be present in a process for manufacturing, e.g., interferometric modulators of the general type illustrated in FIGS. 1 and 7, along with other steps not shown in FIG. 9. FIGS. 10a through 10c schematically illustrate an embodiment of a method for fabricating a MEMS device. With reference to FIGS. 9 and 10, the process 900 begins at step 905 with the depositing of a polymer layer 510 over a substrate 500 as depicted in FIG. 10a. In one embodiment, the polymer is a heat vaporizable polymer such as an aliphatic polycarbonate, one example being poly(cyclohexene carbonate). Other heat-vaporizable polymers may be used including organic and inorganic polymers. The polymer serves as a sacrificial layer similar to the sacrificial layer formed in step 810 of FIG. 8. The substrate 500 may comprise a material that is etchable by xenon diflouride. The deposition in step 905 may take many forms such as spin coating, extrusion coating, spray coating and printing. In one embodiment, inkjet deposition is used. In one embodiment, the heat vaporizable polymer is self planarizing. In one embodiment, the substrate 500 may comprise any transparent material such as glass or a heat resistant plastic that is not unduly affected by temperatures that bring about vaporization of the sacrificial polymer layer 510. In another embodiment, the substrate 500 can comprise an optical stack 16 as in FIGS. 1 and 7.

The process 900 illustrated in FIG. 9 continues at step 910 with the formation of an electrically conductive layer 520 over the polymer layer 510 as depicted in FIG. 10b. In one embodiment, the electrically conductive layer is part of the movable reflective layer 14 in FIGS. 1 and 7. Since the sacrificial polymer layer 510 is still present at step 910 of the process 900, the movable reflective layer 14 is typically not movable at this stage. A partially fabricated MEMS device, e.g. a partially fabricated interferometric modulator, that contains the sacrificial polymer layer 510 may be referred to herein as an "unreleased" MEMS device. The electrically conductive layer 520 may comprise a metal (e.g. aluminum or aluminum alloy). Since process 900 uses vaporization, at step 915, to remove the polymer layer 510, materials that are etchable by $XeF_2$ may also be used for the electrically conductive layer. Such $XeF_2$-etchable materials comprise titanium, tungsten and tantalum. Forming the electrically conductive layer 520 in step 910 may include one or more deposition steps as well as one or more patterning or masking steps.

Process 900 continues at step 915 with the vaporization of at least a portion of the heat vaporizable polymer layer 510 resulting in a cavity 530 as depicted in FIG. 10c. In one embodiment, the vaporizing step 915 comprises heating.

Heating may be done on a heated plate, in an oven, in a kiln or by using any heating device capable of achieving and maintaining a temperature sufficient to vaporize the polymer for a long enough time that substantially all of the polymer vaporizes. In one embodiment, the heat vaporizable polymer is poly(cyclohexene carbonate) which vaporizes at about 300° C. Other heat vaporizable materials may be used. Materials that may be used include those that vaporize in temperature ranges high enough to be in a solid state during steps 905 and 910 and other steps not shown in FIG. 9, but vaporize at temperatures low enough such that other materials present during the vaporizing step 915 are not unduly affected. In one embodiment, materials present during step 915 include materials in the movable reflective layer 14, materials in the optical stack 16, materials in the substrate 20 and materials in the post 18 as shown in FIGS. 1 and 7. In one embodiment, a vaporization temperature range of about 200° C. to about 350° C. is acceptable. In this embodiment, deposition and patterning steps are preferably carried out at temperatures below the 200° C. vaporization temperature in order not to vaporize the polymer layer prematurely. In this embodiment, the 350° C. temperature may be about the maximum temperature that other materials, such as aluminum and indium tin oxide, can withstand without adverse effects. Adverse effects of heating may include hillocking, transmission and/or electrical resistance change. The heat vaporizable material should be a material that vaporizes within an acceptable temperature range and where substantially all (greater than about 95% by weight) of the heat vaporizable material is removed. Preferably, the heat vaporizable material vaporizes relatively quickly, e.g., within about 10 seconds to about 30 minutes, at the vaporization temperature.

In one embodiment a patterning step (not shown in FIGS. 9 or 10) may take place after step 905 and before the formation of the electrically conductive layer 520 in step 910. This patterning may comprise techniques such as electron beam lithography and image transfer. The patterning may be done to form a support structure aperture in the polymer layer 510. After the patterning, a depositing step (not shown in FIG. 9) may take place. A non-conductive material may be deposited into the support structure aperture formed in the patterning step to form a post 18 as shown in FIGS. 1 and 7. Step 910 may then form the electrically conductive layer 520 over the polymer layer 510 and over the post such that the post will support the electrically conductive-layer after removal of the polymer layer 510 in step 915. In one embodiment, XeF$_2$-etchable materials may be used in forming at least part of the post structure. XeF$_2$-etchable materials suitable for the post structure include molybedenum and silicon-containing materials, such as silicon itself (including amorphous silicon, polysilicon, and crystalline silicon), as well as silicon germanium and silicon nitride. In some embodiments, the process 900 may include additional steps and the steps may be rearranged from the illustrations of FIGS. 9 and 10.

Figure 11A:
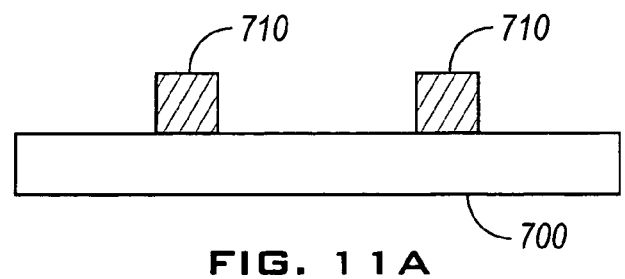
FIGS. 11a through 11d schematically illustrate an embodiment of a method for fabricating a MEMS device.
Figure 11B:
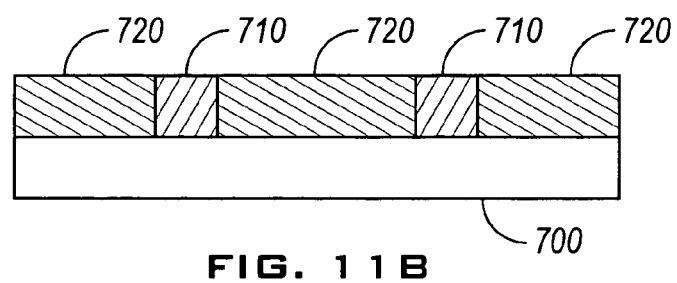

FIGS. 11a through 11d schematically illustrate an embodiment of a method for fabricating a MEMS device. With reference to FIGS. 9 and 11, a depositing step (not shown in FIG. 9) forms post structures 710 on a substrate 700. This depositing step takes place prior to depositing the polymer layer at step 905. In one embodiment, a non-conductive material is deposited to form the post structures 710. In one embodiment, XeF$_2$-etchable materials may be used in forming at least part of the post structures 710. XeF$_2$-etchable materials suitable for the post structure include molybedenum and silicon-containing materials, such as silicon itself (including amorphous silicon, polysilicon, crystalline silicon), as well as silicon germanium and silicon nitride. In one embodiment, the substrate 700 may comprise any transparent material such as glass or a heat resistant plastic that is not unduly affected by temperatures that bring about vaporization of the heat vaporizable polymer layer. In another embodiment, the substrate 700 may comprise an optical stack 16 as in FIGS. 1 and 7. After depositing post structures 710, process 900 continues to step 905 with the depositing of a polymer layer 720 next to the post structures 710 and over the substrate 700 as shown in FIG. 11b.

Figure 11C:
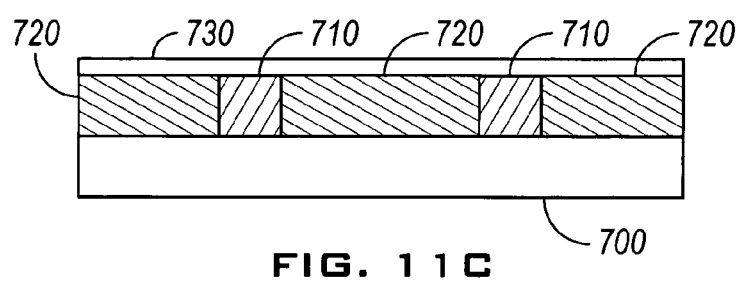

The process 900 continues at step 910 with the formation of an electrically conductive layer 730 over at least a portion of polymer layer 720 and post structures 710 as illustrated in FIG. 11c. In one embodiment, electrically conductive layer 730 is part of the movable reflective layer 14 as illustrated in FIGS. 1 and 7. Since the sacrificial polymer layer 720 is still present at step 910 of the process 900, the movable reflective layer 14 is typically not movable at this stage. A partially fabricated MEMS device, e.g. a partially fabricated interferometric modulator, that contains the sacrificial polymer layer 720 may be referred to herein as an "unreleased" MEMS device. The electrically conductive layer 730 may comprise a metal (e.g. aluminum or aluminum alloy). Since the process 900 uses vaporization, at step 915, to remove the polymer layer 720, materials that are etchable by XeF$_2$ may also be used for the electrically conductive layer. Such XeF$_2$-etchable materials comprise titanium, tungsten and tantalum. Forming the electrically conductive layer 730 in step 910 may include one or more deposition steps as well as one or more patterning or masking steps.

Figure 11D:
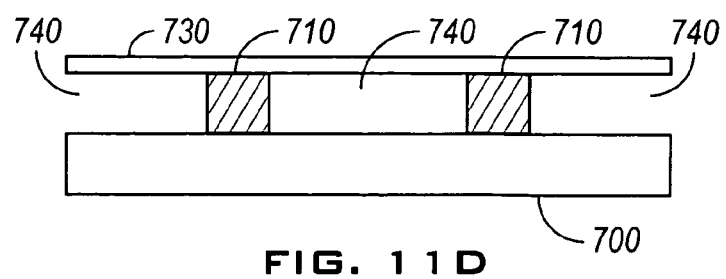

The process 900 continues at step 915 with the vaporization of the sacrificial polymer layer 720 resulting in a cavity 740 as illustrated in FIG. 11d. In one embodiment, the vaporizing step 915 comprises heating. Heating may be done on a heated plate or in an oven, kiln or any heating device capable of achieving and maintaining a temperature sufficient to vaporize the polymer for a long enough time that substantially all of the polymer vaporizes. FIG. 11d depicts a MEMS device, e.g., an interferometric modulator, in a released state. In some embodiments, the process 900 may include additional steps and the steps may be rearranged from the illustrations of FIGS. 9 and 11.

Figure 12:
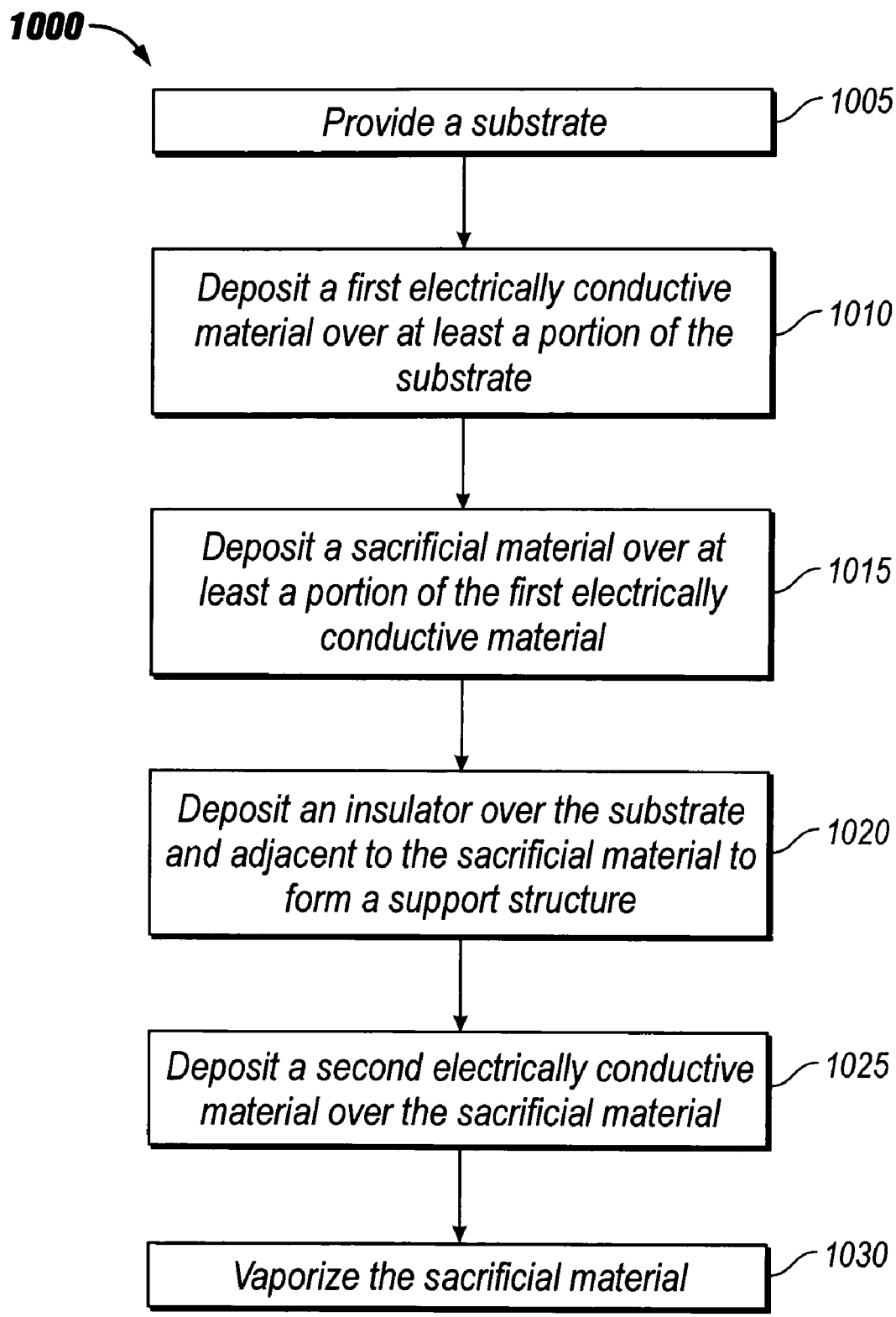
FIG. 12 is a flow diagram illustrating an embodiment of a method of making an interferometric modulator.
Figure 13A:
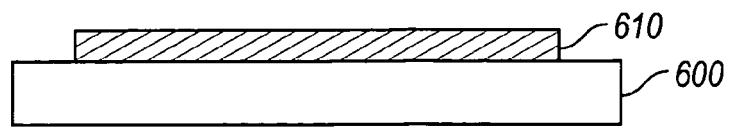
FIGS. 13a through 13e schematically illustrate an embodiment of a method for fabricating an interferometric modulator.
Figure 13B:
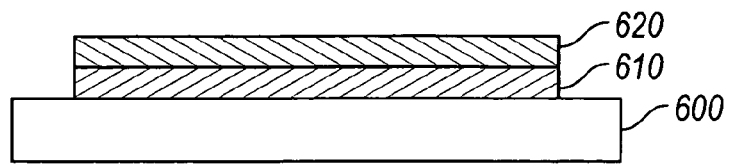

FIG. 12 is a flow diagram illustrating certain steps in another embodiment of a method of making an interferometric modulator. Such steps may be present in a process for manufacturing, e.g., interferometric modulators of the general type illustrated in FIGS. 1 and 7, along with other steps not shown in FIG. 12. FIGS. 13a through 13e schematically illustrate an embodiment of a method for fabricating an interferometric modulator. With reference to FIGS. 12 and 13, the process 1000 begins at step 1005 with providing a substrate 600 as depicted in FIG. 13a. In one embodiment, the substrate 600 may comprise any transparent material such as glass or a heat resistant plastic that is not unduly affected by temperatures that bring about vaporization of a heat vaporizable sacrificial polymer. Process 1000 continues at step 1010 with the deposition of a first electrically conductive material 610 over at least a portion of the substrate 600 as depicted in FIG. 13a. The first electrically conductive material 610 can be part of the optical stack 16 depicted in FIGS. 1 and 7. In one embodiment the first electrically conductive layer comprises indium tin oxide. At step 1015, a sacrificial layer 620, comprising a heat vaporizable material, is deposited over at least a portion of the first electrically conductive material 610 as illustrated in FIG. 13b. The sacrificial layer 620 may be deposited by techniques such as spin coating, extrusion coating, spray coating and printing. The sacrificial layer 620 is deposited in thicknesses and locations to provide for a cavity of the desired size between the first electrically conductive layer and the second electrically conductive layer deposited in step 1025. The sacrificial layer may be deposited in select locations by, e.g., printing techniques, one of which is inkjet deposition. In one embodiment the sacrificial layer is printed onto locations adjacent to post structure locations (already deposited post structures or to-be-deposited post structure locations).

Figure 13C:
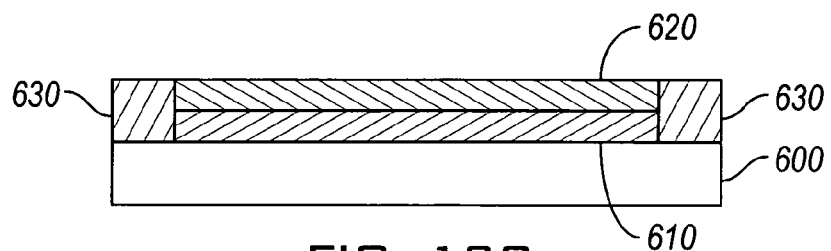
Figure 13D:
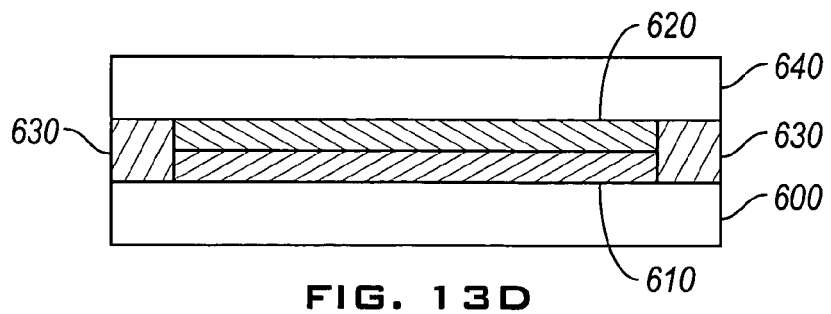

The process 1000 continues at step 1020 with the deposition of an insulator over the substrate 600 and adjacent to the sacrificial material 620 (or adjacent to the location of a to-be-deposited sacrificial material) to form a support structure 630 as depicted in FIG. 13*c*. In one embodiment, step 1020 is performed before step 1015 (similar to the schematic illustration of FIG. 11), thereby eliminating a patterning step (not shown in FIG. 10) to form a support post aperture. The insulator material may be used, in. an embodiment, to form support posts 18 in FIGS. 1 and 7. The insulator material may include materials etchable by $XeF_2$ as discussed above. Continuing at step 1025, a second electrically conductive material 640 is deposited over at least a portion of the sacrificial material 620 as depicted in FIG. 13*d*. The second electrically conductive material 640 may be part of the movable reflective layer 14 of FIGS. 1 and 7. The movable reflective layer 14 is configured such that the post structure supports the movable reflective layer including the second electrically conductive layer 640.

Figure 13E:
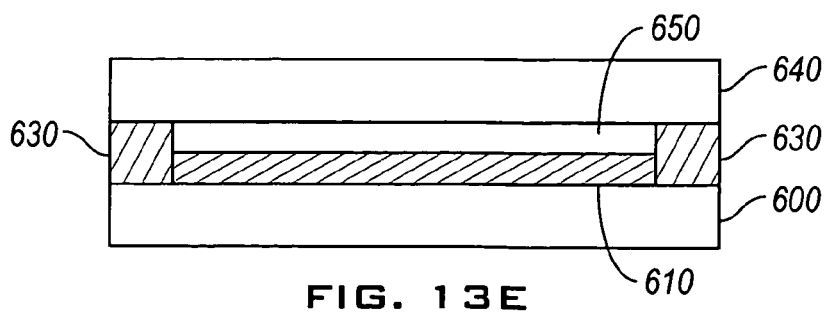

After step 1025, the partially fabricated interferometric modulater is in an unreleased state. In one embodiment, the unreleased interferometric modulator depicted in FIG. 13*d* includes a first electrically conductive material 610 that is a partially reflective layer, a second electrically conductive material 640 that is a movable reflective layer, a sacrificial material 620, the sacrificial material being removable by heat-vaporization to thereby form a cavity 650, and the support structure 630 is a support post. The act of releasing the interferometric modulator is performed at step 1030 by vaporizing the sacrificial material 620 resulting in the cavity 650 as depicted in FIG. 13*e*. In one embodiment, vaporization is accomplished by heating the entire unreleased interferometric modulator to a temperature and for a duration sufficient to remove substantially all of the sacrificial material. After step 1030, the interferometric modulator is in a released state. In some embodiments, the process 1000 may include additional steps and the steps may be rearranged from the illustrations of FIGS. 12 and 13.

An embodiment of an unreleased interferometric modulator includes a first means for reflecting light, a second means for reflecting light, a first means for supporting the second reflecting means, and a second means for supporting the second reflecting means, where the first supporting means comprises a sacrificial material, the sacrificial material being removable by heat-vaporization to thereby form a cavity defined by the first reflecting means, the second reflecting means, and the second supporting means. With reference to FIG. 13*d*, aspects of this embodiment include where the first reflecting means is a partially reflective layer, such as the first electrically conductive material 610, where the second reflecting means is a movable reflective layer such as the second electrically conductive material 640, where the first supporting means is a sacrificial layer such as the sacrificial material 620, and where the second supporting means is a support post such as the support structure 630.

In one embodiment, the process 900 in FIG. 9 and/or the process 1000 in FIG. 12 may include a patterning step that comprises forming vent holes in the other materials, including, e.g., one or more of the substrates, the electrically conductive layers and/or any other structures present in the MEMS device or interferometric modulator. The vent holes, which may be similar to vent holes used in etching processes, serve as exit pathways for the vaporized sacrificial materials.

In an embodiment, vent holes are eliminated or reduced in number and/or size, and the sacrificial material, in this example a heat vaporizable polymer, escapes to the sides of the moveable reflective layer.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making a microelectromechanical system (MEMS) device, comprising:
   depositing a polymer layer over a substrate;
   forming an optical layer over the substrate, the optical layer being at least partially reflective;
   forming an electrically conductive layer over the polymer layer; and
   forming an optical cavity by heat vaporizing the polymer layer at a temperature no greater than about 350 degrees C., thereby exposing the optical layer to the optical cavity.

2. The method of claim 1, wherein the substrate comprises a second electrically conductive layer.

3. The method of claim 1, wherein the electrically conductive layer comprises a movable layer.

4. The method of claim 1, wherein the MEMS device is an interferometric modulator.

5. The method of claim 1, wherein the heat vaporizing comprises heating to a temperature in the range of from about 200 degrees C. to about 350 degrees C.

6. The method of claim 1, wherein the electrically conductive layer comprises a metal.

7. The method of claim 1, wherein the polymer layer comprises an organic polymer.

8. The method of claim 1, wherein the substrate comprises the optical layer.

9. The method of claim 1, further comprising patterning the polymer layer.

10. The method of claim 1, wherein depositing the polymer layer comprises at least one of spin coating, extrusion coating, spray coating, and printing.

11. The method of claim 1, comprising forming the optical layer over the polymer layer.

12. The method of claim 1, wherein the polymer layer is self planarizing.

13. The method of claim 1, wherein the polymer layer comprises a heat-depolymerizable polycarbonate (HDP).

14. The method of claim 1, wherein the polymer layer is heat vaporized at a temperature no greater than about 300 degrees C.

15. The method of claim 2, wherein the second electrically conductive layer comprises indium tin oxide.

16. The method of claim 8, wherein the optical layer comprises a dielectric layer.

17. The method of claim 8, comprising depositing the polymer layer over the optical layer.

18. The method of claim 9, wherein the patterning comprises at least one of electron beam lithography and image transfer.

19. The method of claim 9, further comprising:

forming a support structure aperture in the polymer layer; and depositing a non-conductive material into the support structure aperture.

20. The method of claim 10, wherein printing comprises inkjet deposition.

21. The method of claim 13, wherein the HDP comprises poly(cyclohexene carbonate) or an aliphatic polycarbonate.

* * * * *

UNITED STATES PATENT AND TRADEMARK OFFICE
CERTIFICATE OF CORRECTION

| | |
|---|---|
| PATENT NO. | : 7,795,061 B2 |
| APPLICATION NO. | : 11/321134 |
| DATED | : September 14, 2010 |
| INVENTOR(S) | : Wang et al. |

It is certified that error appears in the above-identified patent and that said Letters Patent is hereby corrected as shown below:

On Page 1 (Item 56), Column 2, Line 5, under Other Publications, delete ""Maniature" and insert -- "Miniature --, therefor.

On Page 1 (Item 56), Column 2, Line 8, under Other Publications, delete "Internatioal" and insert -- International --, therefor.

On Page 1 (Item 56), Column 2, Line 8, under Other Publications, delete "Andactuators," and insert -- And Actuators --, therefor.

On Page 1 (Item 56), Column 2, Line 9, under Other Publications, delete "Youk" and insert -- York --, therefor.

On Page 3 (Item 56), Column 1, Line 64, under U.S. Patent Documents, below "5,967,163 A 10/1999 Chou et al." insert -- 5,968,796 11/1999 Miles --.

On Page 4 (Item 56), Column 1, Line 6, under U.S. Patent Documents, below "6,666,561 B1 12/2003 Blakley" insert -- 6,674,033 1/2003 Chui et al. --.

On Page 6 (Item 56), Column 1, Line 31, under Other Publications, delete "microelectomechanical systesm" and insert -- microelectromechanical system --, therefor.

On Page 6 (Item 56), Column 1, Line 39, under Other Publications, delete "XactiX" and insert -- Xactix --, therefor.

On Page 6 (Item 56), Column 1, Line 53, under Other Publications, delete "Quanum" and insert -- Quantum --, therefor.

On Page 6 (Item 56), Column 2, Line 9, under Other Publications, delete "ct" and insert -- et --, therefor.

On Page 6 (Item 56), Column 2, Line 15, under Other Publications, delete "ct" and insert -- et --, therefor.

Signed and Sealed this
First Day of March, 2011

David J. Kappos
*Director of the United States Patent and Trademark Office*

CERTIFICATE OF CORRECTION (continued)
U.S. Pat. No. 7,795,061 B2

On Page 6 (Item 56), Column 2, Line 59, under Other Publications, delete "Cl" and insert -- et --, therefor.

On Page 6 (Item 56), Column 2, Line 66, under Other Publications, delete "Micromachincd" and insert -- Micromachined --, therefor.

On Page 7 (Item 56), Column 1, Line 8, under Other Publications, delete "Wu" and insert -- Wu, --, therefor.

On Page 7 (Item 56), Column 2, Line 10, under Other Publications, delete "Aluminoa" and insert -- Alumina --, therefor.

On Page 7 (Item 56), Column 2, Line 12, under Other Publications, delete "B321-8327" and insert -- Alumina --, therefor.

On Page 7 (Item 56), Column 2, Line 17, under Other Publications, delete "compatable" and insert -- B321-B327 --, therefor.

On Page 7 (Item 56), Column 2, Lines 18-19, under Other Publications, delete "Jun. 1996" and insert -- Jun. (1996) --, therefor.

On Page 7 (Item 56), Column 2, Line 21, under Other Publications, delete "vo" and insert -- vol. --, therefor.

In Column 2, Line 26, delete "diflouride." and insert -- difluoride. --, therefor.

In Column 7, Line 49, after "the" insert -- antenna transmits and --.

In Column 9, Line 64, delete "respect-to" and insert -- respect to --, therefor.

In Column 12, Line 12, delete "diflouride." and insert -- difluoride. --, therefor.

In Column 12, Line 34, delete "diflouride." and insert -- difluoride. --, therefor.

In Column 13, Line 49, delete "molybedenum" and insert -- molybdenum --, therefor.

In Column 13, Line 64, delete "molybedenum" and insert -- molybdenum --, therefor.

In Column 15, Line 28, delete "modulater" and insert -- modulator --, therefor.